(12) United States Patent
Majumdar et al.

(10) Patent No.: US 9,059,318 B2
(45) Date of Patent: Jun. 16, 2015

(54) STRESSED SOURCE/DRAIN CMOS AND METHOD OF FORMING SAME

(75) Inventors: Amlan Majumdar, Yorktown Heights, NY (US); Xinhui Wang, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1039 days.

(21) Appl. No.: 12/551,286

(22) Filed: Aug. 31, 2009

(65) Prior Publication Data

US 2011/0049630 A1    Mar. 3, 2011

(51) Int. Cl.
*H01L 29/82*   (2006.01)
*H01L 21/84*   (2006.01)
*H01L 21/8238* (2006.01)
*H01L 27/12*   (2006.01)
*H01L 29/78*   (2006.01)

(52) U.S. Cl.
CPC ........ *H01L 21/84* (2013.01); *H01L 21/823807* (2013.01); *H01L 21/823814* (2013.01); *H01L 27/1203* (2013.01); *H01L 29/7848* (2013.01)

(58) Field of Classification Search
USPC ................... 257/255, 358, 369, 254, 417, 418
See application file for complete search history.

(56) References Cited

U.S. PATENT DOCUMENTS

| | | | |
|---|---|---|---|
| 6,833,556 B2 * | 12/2004 | Grupp et al. ............... | 257/24 |
| 2007/0254461 A1 * | 11/2007 | Wei et al. .................. | 438/514 |
| 2008/0006818 A1 * | 1/2008 | Luo et al. .................. | 257/19 |

\* cited by examiner

*Primary Examiner* — Samuel Gebremariam

(57) ABSTRACT

A complementary metal-oxide semiconductor (CMOS) structure includes a substrate and a P-type field effect transistor (FET) and an N-type FET disposed adjacent to one another on the substrate. Each FET includes a silicon-on-insulator (SOI) region, a gate electrode disposed on the SOI region, a source stressor, and a drain stressor disposed across from the source stressor relative to the gate electrode, wherein proximities of the source stressor and the drain stressor to a channel of a respective FET are substantially equal.

13 Claims, 7 Drawing Sheets

STRESSED SOURCE/DRAIN CMOS AND METHOD OF FORMING SAME

BACKGROUND

1. Technical Field

The present invention is related generally to complementary metal-oxide-semiconductor (CMOS) field-effect transistors, and more particularly to CMOS with embedded source/drain stressors and CMOS with raised source/drain.

2. Discussion of Related Art

Complementary metal-oxide semiconductor (CMOS) field-effect transistors (FETs) are employed in almost every electronic circuit application, such as signal processing, computing, and wireless communications. CMOS chips in manufacturing comprise of planar thick-body devices on bulk Si substrates or on silicon-on-insulator (SOI) substrates. Thick-body FETs on SOI substrates are also referred to as partially-depleted SOI (PDSOI) FETs. A CMOS chip consists n-channel FETs (NFETs), p-channel PFETs (PFETs), and other electronic devices, such as but not limited to, diodes, resistors, capacitors, and inductors.

In CMOS circuits/chips comprising of either bulk Si or PDSOI FETs, embedded SiGe (eSiGe) source/drain (SD) is used in PFETs for obtaining uniaxial compressive stress in the channel for mobility and performance enhancement. The eSiGe SD is typically fabricated by (i) forming nitride disposable sidewall spacers and nitride gate cap to encapsulate the PFET gates, and forming nitride disposable cover on the NFET gates, (ii) etching a recess in the PFET SD regions using reactive-ion etch (RIE), and (iii) epitaxially growing SiGe in the recessed PFET SD regions, selective to nitride and oxide. Therefore, the eSiGe SD is laterally a distance $d_{PFET}$ away from the gate edge. Since the gate defines the channel region underneath it, the eSiGe SD stressor is, therefore, a distance $d_{PFET}$ away from the channel.

Embedded SiC source/drain (SD) leads to mobility and performance enhancement when used in NFETs for obtaining uniaxial tensile stress in the channel. The eSiC SD is typically fabricated using processes similar to eSiGe SD fabrication. That is, eSiC SD is fabricated by (i) forming nitride disposable sidewall spacers and nitride gate cap to encapsulate the NFET gates, and forming nitride disposable cover on the PFET gates, (ii) etching a recess in the NFET SD regions using reactive-ion etch (RIE), and (iii) epitaxially growing SiC in the recessed NFET SD regions, selective to nitride and oxide. Therefore, similar to the eSiGe case, the eSiC SD stressor is a distance $d_{NFET}$ away from the channel.

The effectiveness of eSiC and eSiGe SD stressors in enhancing carrier mobility and FET performance depends on the proximity (that is, the distance $d_{NFET}$ or $d_{PFET}$) of the stressors to the channel. A closer proximity, that is, smaller $d_{NFET}$ or $d_{PFET}$, leads to improved stress coupling to the channel, thereby leading to higher enhancement of carrier mobility and FET performance.

Conventional methods of fabrication, similar to the one noted above, can be used for fabricating CMOS structures with NFETs having eSiC SD and PFETs having eSiGe SD. One can also reverse the sequence of eSiGe and eSiC SD formation with eSiC SD for NFETs being formed prior to eSiGe SD for PFETs. Conventional methods of fabrication lead to CMOS structures where the proximity of the NFET and PFET embedded SD stressors to the respective channels is different. The embedded SD that is formed second is further away from its channel than the one that is formed first. Therefore, in these CMOS structures, the effectiveness of the embedded SD stressors will be more for the embedded SD that is formed first and will be less for the embedded SD that is formed next.

Scaling down the gate length of both NFETs and PFETs in CMOS circuits leads to shorter dimensions to increased CMOS circuit speed. The entire semiconductor industry has followed this since the advent of CMOS. However, detrimental short-channel effects lead to high off-state leakage currents in CMOS devices with short gate lengths, thereby increasing the power consumption. In case of extreme short-channel effects, CMOS circuits fail to operate.

Narrow-body planar and non-planar FETs, such as, extremely-thin SOI (ETSOI) FETs, FinFETs, and trigates exhibit significantly superior short-channel characteristics compared to thick-body bulk Si and PDSOI FETs. These FET architectures are, therefore, attractive candidates for future-generation CMOS technology. Narrow-body FETs suffer from high series resistance. This problem is alleviated by epitaxially forming raised source/drain (RSD). This structure can be formed using process similar to those used for forming embedded SD (with the general exception of skipping the recess etch step). Similarly, one can form CMOS using thin-body FETs with SiC RSD for NFETs and SiGe RSD for PFETs.

Similar to the case of thick-body CMOS with embedded SD discussed earlier, eSiC and eSiGe RSD can also impart favorable tensile and compressive stress to NFET and PFET channels, respectively. Also, similar to the thick-body CMOS case, it is also well known in literature that the effectiveness of eSiC and eSiGe RSD stressors in enhancing carrier mobility and FET performance depends on the proximity (that is, the distance $d_{NFET}$ or $d_{PFET}$) of the stressors to the channel. A closer proximity, that is, smaller $d_{NFET}$ or $d_{PFET}$, leads to better stress coupling to the channel, thereby leading to higher enhancement of carrier mobility and FET performance.

Therefore, a need exists for a method for the fabrication of embedded SD CMOS where the proximity of an embedded SD is substantially the same for both NFETs and PFETs and for fabrication of thin-body FET CMOS with SiC RSD NFETs and SiGe RSD PFETs with the proximity of the RSD being low and substantially the same for both NFETs and PFETs.

BRIEF SUMMARY

According to an embodiment of the present disclosure, a complementary metal-oxide semiconductor (CMOS) structure includes a substrate, a P-type field effect transistor (FET), and an N-type FET disposed adjacent to one another on the substrate. Each FET includes a silicon-on-insulator (SOI) region, a gate electrode disposed on the SOI region, a source stressor, and a drain stressor disposed across from the source stressor relative to the gate electrode, wherein proximities of the source stressor and the drain stressor to a channel of a respective FET are substantially equal.

According to an embodiment of the present disclosure, a method for forming a complementary metal-oxide semiconductor (CMOS) structure with equal proximity of source/drain (SD) stressors to channels of adjacent N-type and P-type field effect transistors (FETs) formed on a substrate includes forming a spacer comprising a stack comprising a top nitride layer, an oxide layer, and a lower nitride layer, wherein the lower nitride layer determines the proximity of the SD stressors to the channel for the N-type and P-type FETs, forming a photoresist on the CMOS structure which covers the N-type FET and exposes the P-type FET, implanting ions in an exposed portion of the top nitride layer of the P-type FET, etching, selectively, an exposed portion of the top nitride layer and a portion of the oxide layer below the exposed portion of the top nitride layer, removing the photoresist to expose the spacer on the N-type FET, forming a nitride spacer on sidewalls of a gate electrode of the P-type FET, wherein remaining portions of the lower nitride layer on the P-type FET are removed, forming the SD stressors of the P-type FET on opposite sides of the gate electrode, wherein a distance between the SD stressors and the P-type FET is controlled by the nitride spacer, depositing a dielectric layer over the CMOS structure, forming a photoresist on the CMOS structure which covers the P-type FET and exposes the N-type FET, implanting ions in an exposed portion of the top nitride layer of the N-type FET, etching, selectively, an exposed portion of the top nitride layer and a portion of the oxide layer below the exposed portion of the top nitride layer, removing the photoresist to expose the spacer on the P-type FET, forming a nitride spacer on sidewalls of a gate electrode of the N-type FET, wherein remaining portions of the lower nitride layer on the N-type FET are removed, forming the SD stressors of the N-type FET on opposite sides of the gate electrode, wherein a distance between the SD stressors and the N-type FET is controlled by the nitride spacer, and removing the dielectric layer from the P-type FET.

According to an embodiment of the present disclosure, a method for forming a complementary metal-oxide semiconductor (CMOS) structure with equal proximity of source/drain (SD) stressors to channels of adjacent N-type and P-type field effect transistors (FETs) formed on a substrate comprises forming a spacer comprising a stack comprising a top nitride layer, an oxide layer, and a lower nitride layer, wherein the lower nitride layer determines the proximity of the SD stressors to the channel for the N-type and P-type FETs, and forming, selectively, the SD stressors on opposite sides of gate electrodes of the N-type FET and the P-type FET, wherein the gate electrodes are formed on respective silicon-on-insulator layers.

BRIEF DESCRIPTION OF THE SEVERAL VIEWS OF THE DRAWINGS

Preferred embodiments of the present disclosure will be described below in more detail, with reference to the accompanying drawings.

DETAILED DESCRIPTION

According to an embodiment of the present disclosure, CMOS with embedded source/drain stressors and CMOS with raised source/drain may be formed having substantially equal distances $d_{NFET}$ or $d_{PFET}$.

In FIGS. 1A-L the CMOS devices are denoted as FET-1 and FET-2. If FET-1 is NFET, then FET-2 will be PFETs. Similarly, if FET-1 is PFET, then FET-2 will be NFET.

Figure 1A:
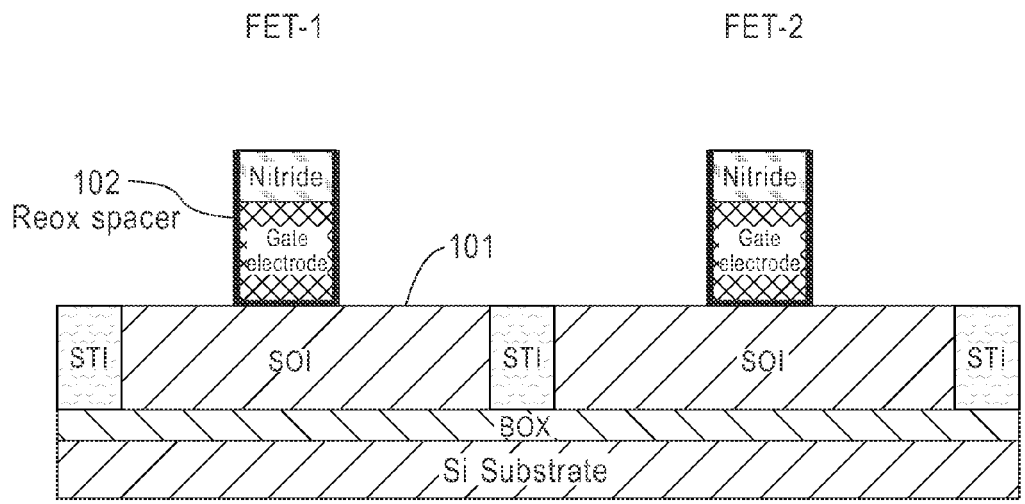
FIGS. 1A-L illustrate an exemplary method for fabricating an embedded SD CMOS according to an embodiment of the present disclosure.

Given a wafer, conventional CMOS processing up to reox spacer 102 formation on a silicon-on-insulator (SOI) substrate 101 leads to a thick-body PDSOI structure shown in FIG. 1A. An exemplary process for the formation of the structure of FIG. 1A includes an active area definition using pad oxidation, pad nitride deposition, active area lithography, active area etch, resist strip, optional shallow trench isolation (STI) liner deposition, STI oxide deposition, optional STI oxide densification anneal, and STI chemical mechanical polish (CMP); removal of any remaining STI oxide on active areas followed by removal of pad nitride; channel implants (also known as well implants) using lithography, ion implantation, and resist strip (performed once for NFETs and once for PFETs); gate stack formation using pad oxide removal, oxidation to form the gate dielectric, poly Si deposition to form the gate electrode, oxidation to form poly Si screen oxide for gate ion implants; optional gate pre-doping using photolithography, ion implantation, and resist strip (performed once for NFETs and once for PFETS); nitride and oxide cap layer deposition (needed for selective epitaxy); gate definition using lithography, gate stack etch, and resist strip; and oxidation to form reox spacer 102.

Figure 1B:
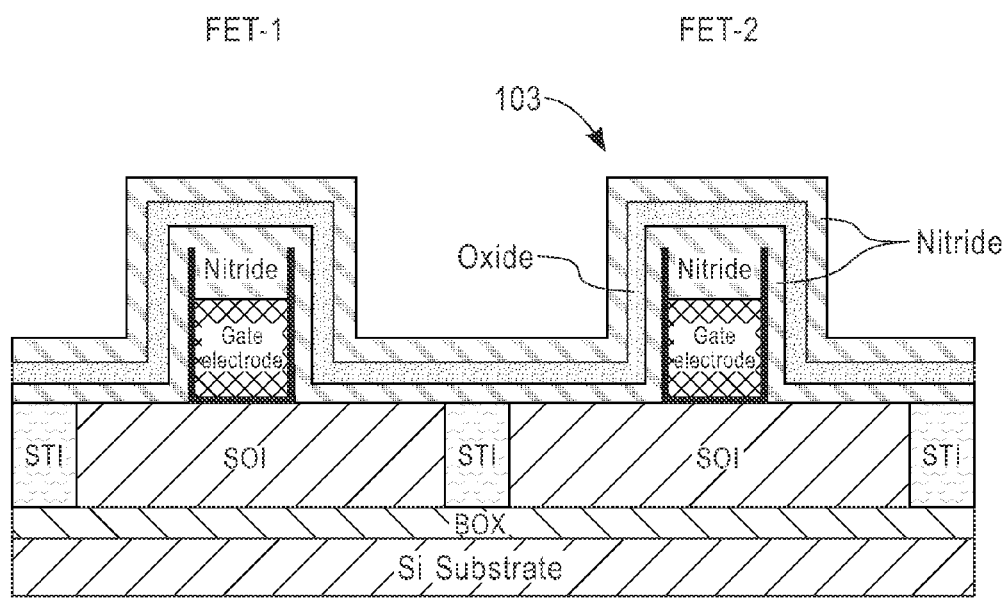
Figure 1C:
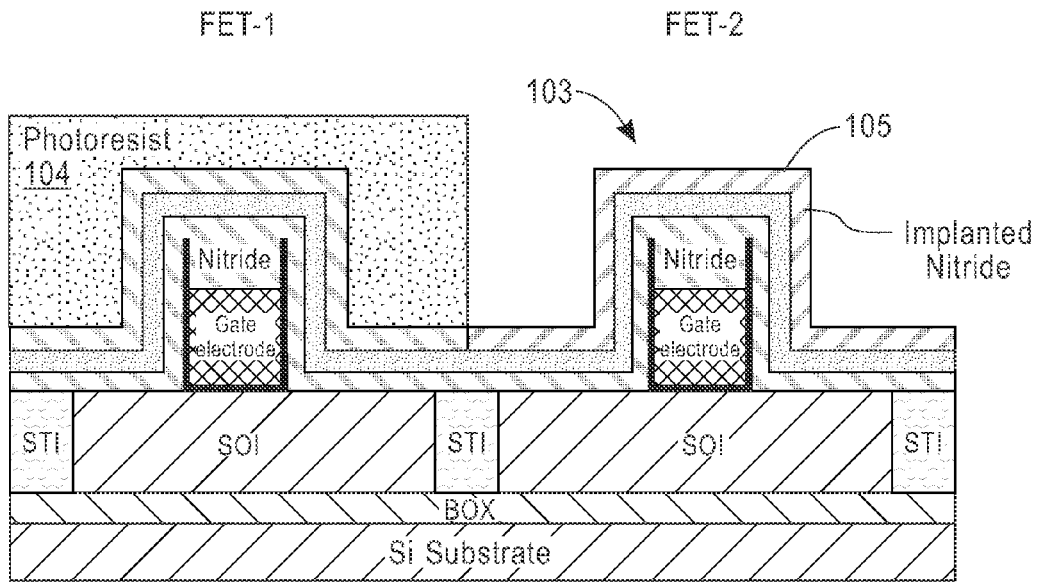
Figure 1D:
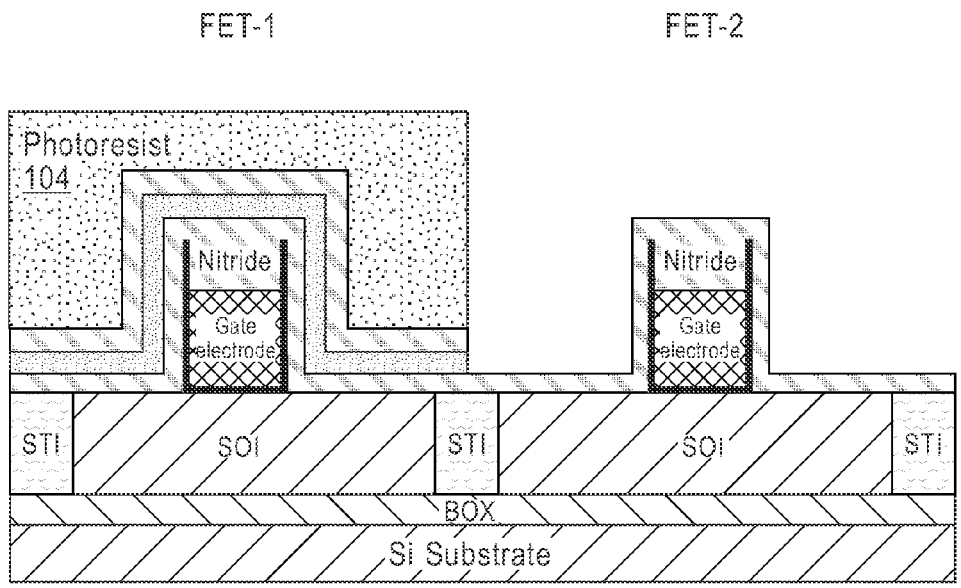
Figure 1E:
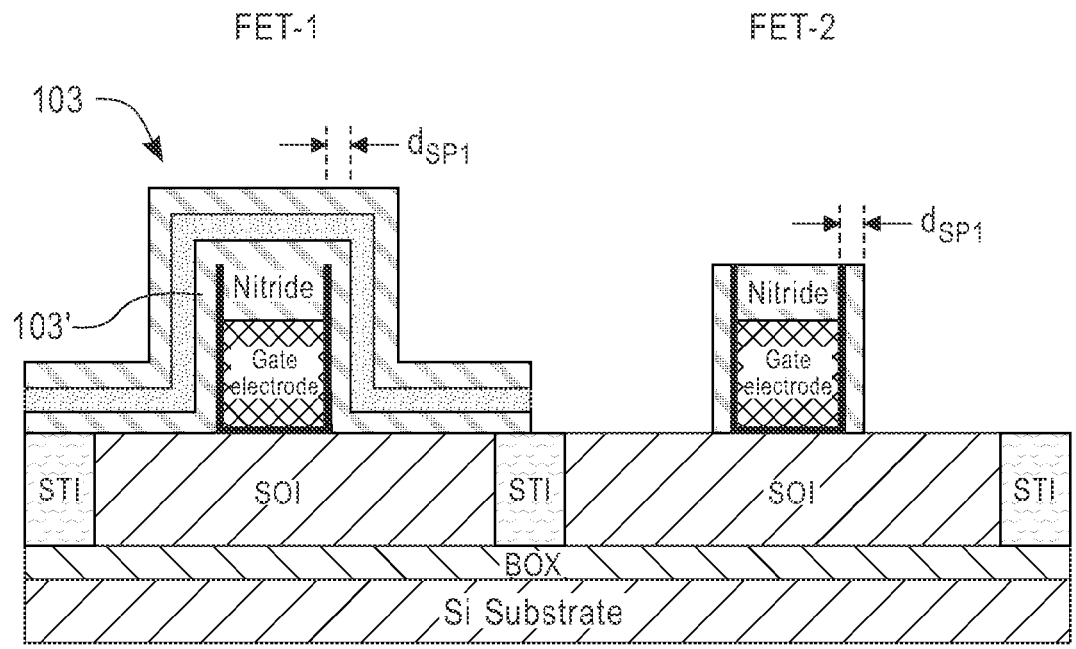

After the formation of reox spacer 102, a triple dielectric layer 103, such as, nitride/oxide/nitride, is deposited, leading to the structure shown in FIG. 1B. Photolithography is performed to cover FET-1 in a photoresist 104 and expose FET-2. Ion implantation is performed on a top layer of the exposed portion of the triple dielectric layer 103 to create implanted nitride top layer 105. The implantation step modifies the etch properties of the top nitride layer. For example, a $BF_2$ implanted nitride can be etched by hydrofluoric acid while unimplanted nitride does not etch in hydrofluoric acid. The wafer is etched in an etchant that can etch both implanted nitride and the oxide beneath it but is selective to photoresist and unimplanted nitride, leading to the structure shown in FIG. 1D. One such etchant is hydrofluoric acid. Nitride RIE is performed with the photoresist intact and the photoresist 104 is then removed, leading to the structure shown in FIG. 1E. FET-2 now has a nitride spacer with width $d_{SP1}$. A width of an inner nitride layer 103' on FET-1 sidewall is also $d_{SP1}$.

Figure 1F:
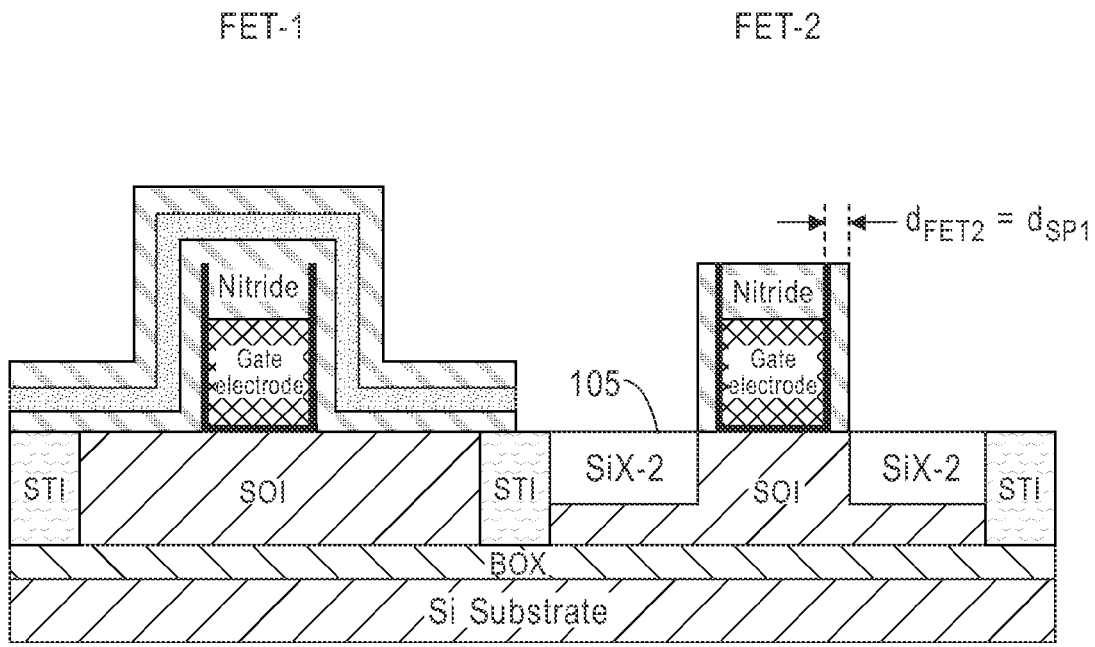

A recess is created in FET-2 SD regions and is followed by selective epitaxy of embedded SD stressor 105, leading to the structure shown in FIG. 1F. The embedded SD stressor 105 for FET-2 is denoted as SiX-2. SiX-2 may be formed of SiC when the FET-2 is NFET and formed of SiGe when FET-2 is PFET. The proximity of SiX-2 SD to FET-2 channel is $d_{FET2}=d_{SP1}$. The channel is formed directly below the respective gate electrode in the SOI.

Figure 1G:
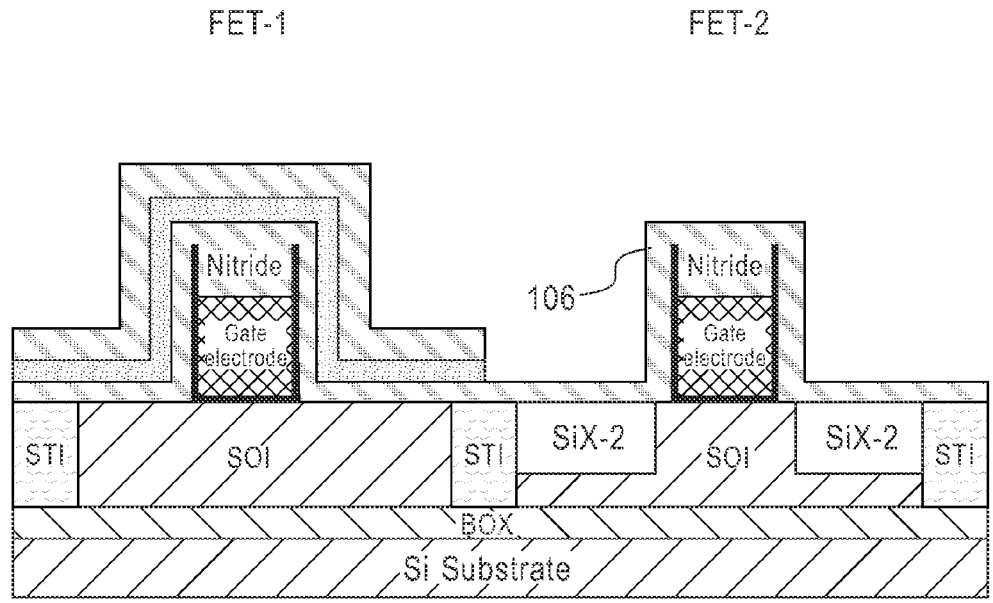
Figure 1H:
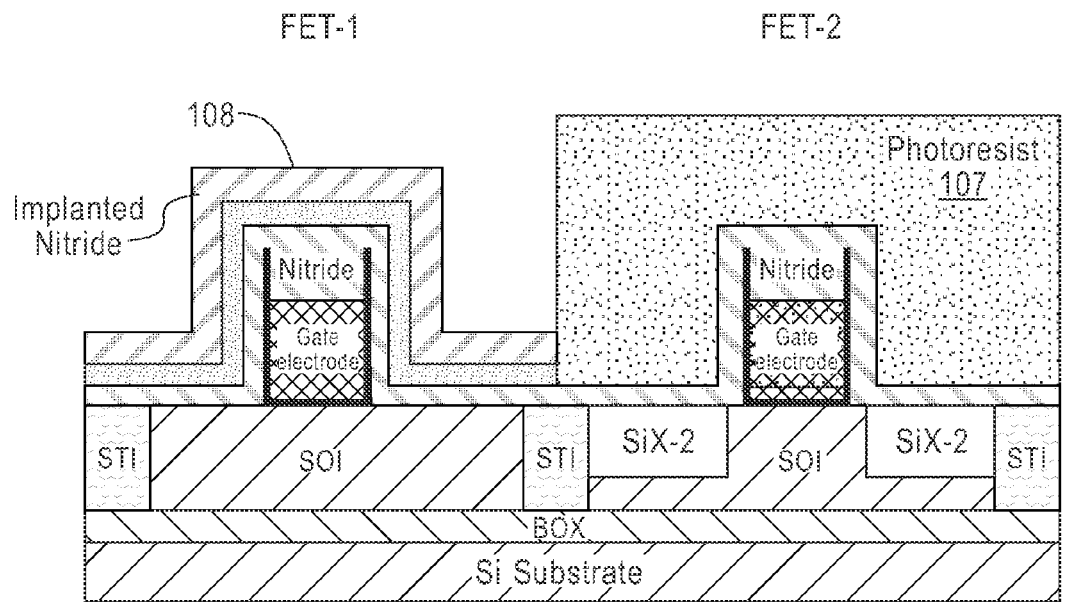
Figure 1I:
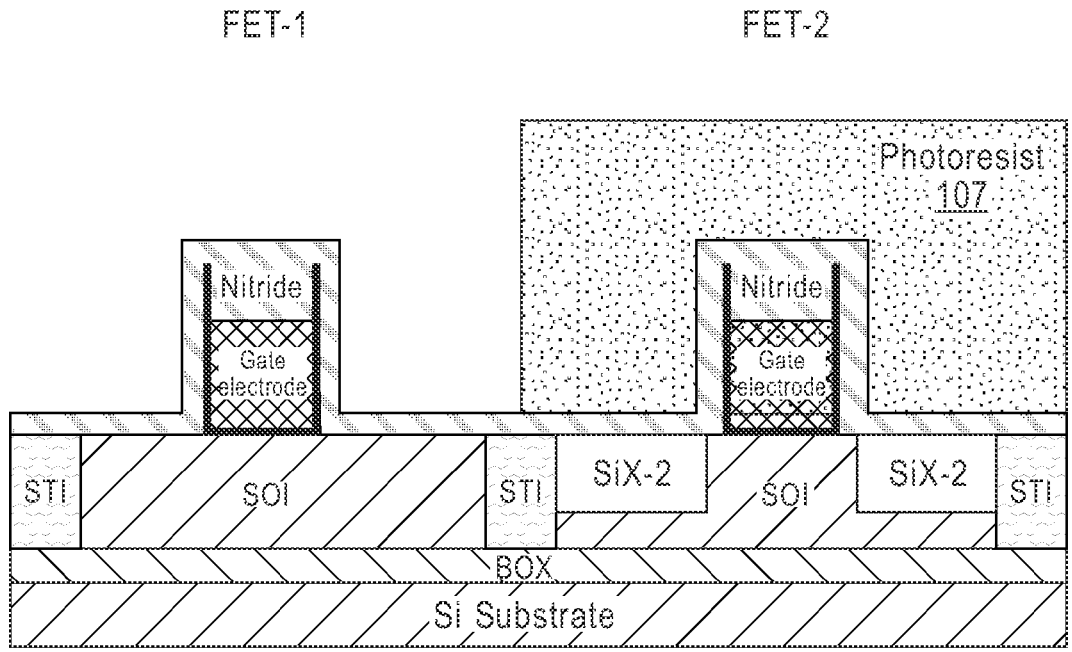
Figure 1J:
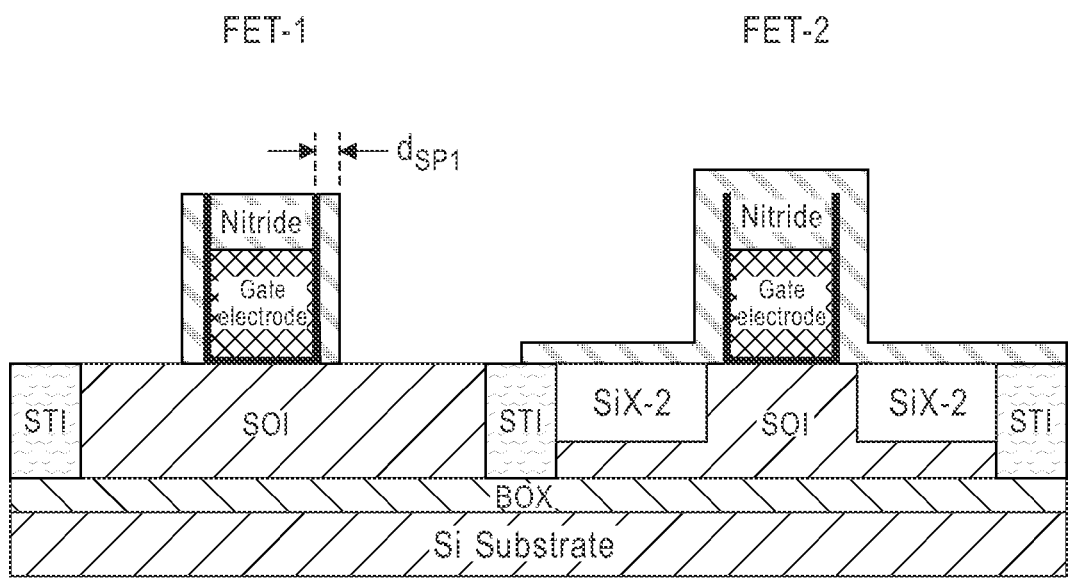

Having formed the embedded SD stressor 105 for FET-2, a single dielectric layer 106, such as, nitride, is deposited, leading to the structure shown in FIG. 1G. Photolithography is then performed to cover FET-2 in a photoresist 107 and expose FET-1. Ion implantation performed on a top nitride layer on FET-1 to create implanted nitride top layer 108, leading to the structure shown in FIG. 1H. The implantation modifies the etch properties of the top nitride layer. For example, as mentioned herein, $BF_2$ implanted nitride can be etched by hydrofluoric acid while unimplanted nitride does not etch in hydrofluoric acid. The wafers are etched in an etchant that can etch both implanted nitride and the oxide beneath it but is selective to photoresist and unimplanted nitride, leading to the structure shown in FIG. 1I. One such etchant is hydrofluoric acid. Nitride RIE is then performed with the photoresist intact and the photoresist 107 is then removed, leading to the structure shown in FIG. 1J. FET-1 now has a nitride spacer with width $d_{SP1}$.

Figure 1K:
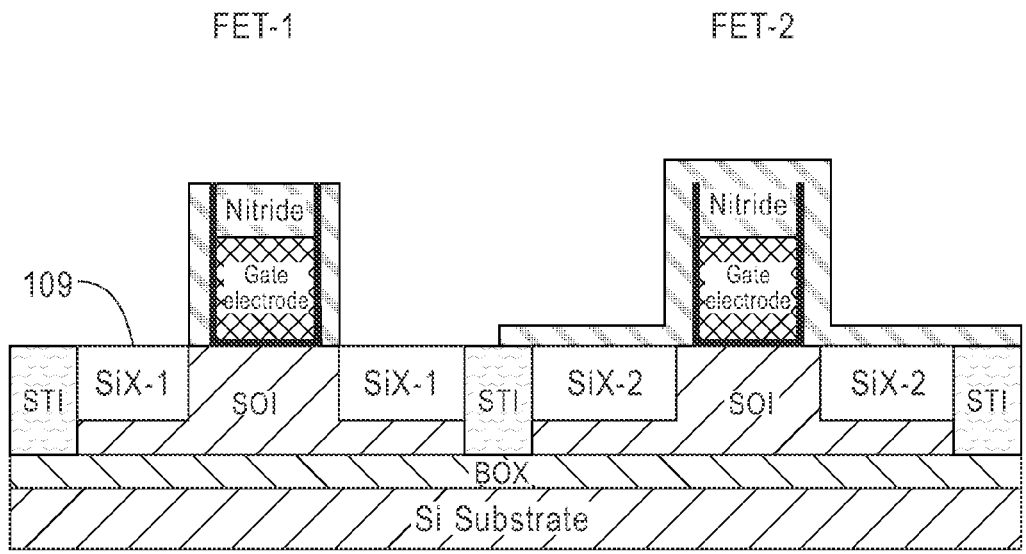
Figure 1L:
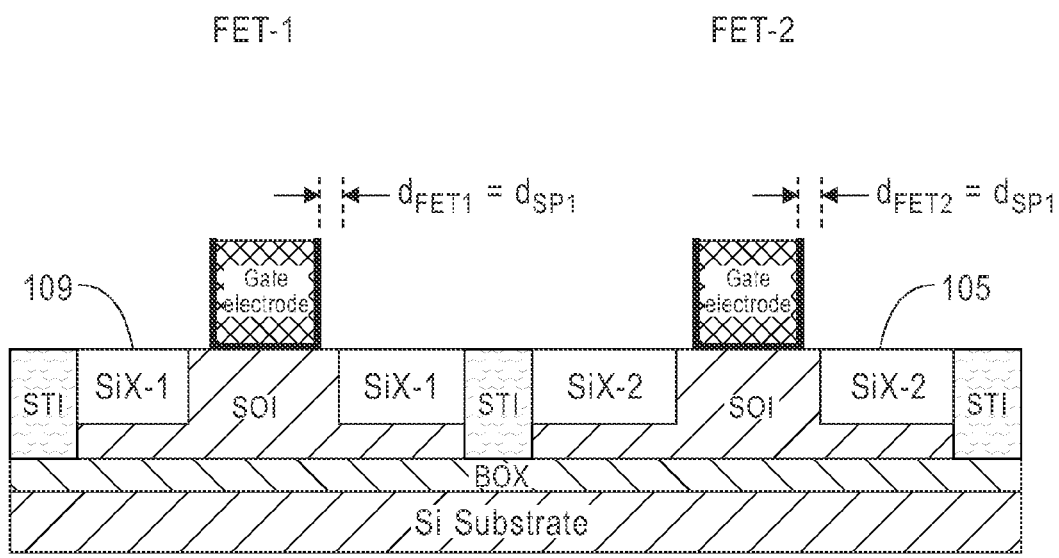

A recess is then created in FET-1 SD regions and is followed by selective epitaxy of an embedded SD stressor 109, leading to the structure shown in FIG. 1K. The embedded SD stressor 109 for FET-1 is denoted as SiX-1. SiX-1 109 may be formed of SiC if FET-1 is NFET and formed of SiGe if FET-1 is PFET. The nitride layers are removed using a nitride etchant, leading to the structure shown in FIG. 1L. The proximity of embedded SiX-1 109 SD to FET-1 channel ($d_{FET1}$)

and embedded SiX-2 105 SD to FET-2 channel ($d_{FET2}$) are both substantially equal to $d_{SP1}$.

Figure 2:
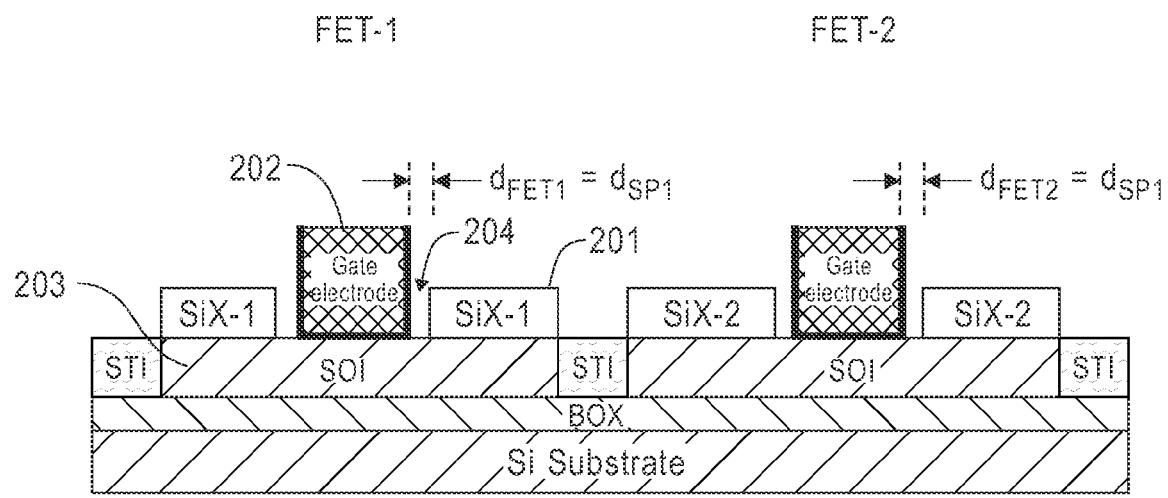
FIG. 2 illustrates an example of a thin-body FET CMOS according to an embodiment of the present disclosure.

Thin-body FETs can be similarly fabricated with a substantially equal proximity of the NFET and PFET raised source/drains (RSD) to the respective channels, leading to the thin-body field-effect transistor structure shown in FIG. 2.

According to an embodiment of the present disclosure, a proximity of a RSD, e.g., 201, to a channel region directly below the gate electrode 202 plays a role in thin-body field-effect transistors (FETs). As shown in FIG. 2, a SOI region 203 underneath a disposable nitride spacer remains thin after RSD epitaxy because the SOI region is covered by nitride during RSD epitaxy. This thin region of SOI, referred to as the source/drain extension (SDE) region 204, is a source of series resistance for thin-body FETs. The resistance of a region is directly proportional to its length. For thin-body FETs, the length of the resistive SDE region is the proximity of the RSD to the channel. A closer proximity, that is, smaller $d_{NFET}$ or $d_{PFET}$, leads to lower series resistance, thereby leading to higher FET drive current and improved FET performance.

Having formed embedded SD or raised SD with equal proximity for both NFETs and PFETs, one can follow conventional processing for chip fabrication.

Having described embodiments for a system and method of discovering a network topology from routing information, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A complementary metal-oxide semiconductor (CMOS) structure comprising:
   a substrate; and
   a P-type field effect transistor (FET) and an N-type FET disposed adjacent to one another on the substrate, each FET comprising,
   a silicon-on-insulator (SOI) region,
   a gate electrode disposed on the SOI region,
   a first spacer formed on sidewalls of the gate electrode, the first spacer having a substantially constant thickness over the entirety of the sidewalls of the gate electrode,
   a channel formed directly below the gate electrode,
   a source stressor spaced apart, laterally, from the first spacer by at least a first distance, and
   a drain stressor disposed across from the source stressor relative to the gate electrode, the drain stressor spaced apart, laterally, from the first spacer by at least the first distance,
   wherein the first distance is larger than the thickness of the first spacer.

2. The CMOS structure of claim 1, wherein the source stressor and the drain stressor are formed in the SOI region.

3. The CMOS structure of claim 1, wherein the source stressor and the drain stressor are formed on the SOI, adjacent to the gate electrode, wherein an extension region is formed in the SOI having a width substantially equal to the distance separating the source stressor and the drain stressor from the channel of the respective FET.

4. The CMOS structure of claim 1, further comprising a shallow trench isolation region disposed between the respective SOI regions of the P-type FET and the N-type FET.

5. The CMOS structure of claim 1, wherein the channel and the gate electrode have a substantially identical width.

6. The CMOS structure of claim 1, further comprising a second spacer disposed between each the gate electrode and the SOI region.

7. A complementary metal-oxide semiconductor (CMOS) structure comprising:
   a substrate; and
   a P-type field effect transistor (FET) and an N-type FET disposed adjacent to one another on the substrate and separated by a shallow trench isolation region, each FET comprising,
   a silicon-on-insulator (SOI) region,
   a gate electrode disposed on the SOI region,
   a first spacer formed on sidewalls of the gate electrode, the first spacer having a substantially constant thickness over the entirety of the sidewalls of the gate electrode,
   a source stressor spaced apart, laterally, from the first spacer by at least a first distance, and
   a drain stressor disposed across from the source stressor relative to the gate electrode, the drain stressor spaced apart, laterally, from the first spacer by at least the first distance,
   wherein proximities of the source stressor and the drain stressor to a channel of a respective FET are substantially equal, and
   wherein the first distance is larger than the thickness of the first spacer.

8. The CMOS structure of claim 7, wherein the source stressor and the drain stressor are formed in the SOI region and at least one of the source stressor and the drain stressor is adjacent to the shallow trench isolation region.

9. The CMOS structure of claim 7, wherein the source stressor and the drain stressor are formed on the SOI region.

10. The CMOS structure of claim 7, wherein the shallow trench isolation region is disposed between the respective SOI regions of the P-type FET and the N-type FET.

11. The CMOS structure of claim 7, wherein the channel is formed directly below the gate electrode.

12. The CMOS structure of claim 11, wherein the channel and the gate electrode have a substantially identical width.

13. The CMOS structure of claim 7, further comprising a second spacer disposed between each of the gate electrode and the SOI region.

* * * * *